US008368049B2

(12) United States Patent
Kawashima et al.

(10) Patent No.: US 8,368,049 B2
(45) Date of Patent: Feb. 5, 2013

(54) NANOWIRE TRANSISTOR AND METHOD FOR FABRICATING THE SAME

(75) Inventors: Takahiro Kawashima, Osaka (JP); Tohru Saitoh, Osaka (JP); Kenji Harada, Osaka (JP); Norishige Nanai, Osaka (JP); Takayuki Takeuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/399,521

(22) Filed: Feb. 17, 2012

(65) Prior Publication Data

US 2012/0156833 A1 Jun. 21, 2012

Related U.S. Application Data

(62) Division of application No. 11/729,949, filed on Mar. 30, 2007, now abandoned.

(30) Foreign Application Priority Data

Mar. 30, 2006 (JP) ................................. 2006-093760

(51) Int. Cl.
*H01L 29/06* (2006.01)
*H01L 31/00* (2006.01)
(52) U.S. Cl. ..................................... 257/13; 257/E29.07
(58) Field of Classification Search ........................ None
See application file for complete search history.

(56) References Cited

U.S. PATENT DOCUMENTS

| 7,102,605 | B2 | 9/2006 | Stumbo et al. |
| 7,135,728 | B2 | 11/2006 | Duan et al. |
| 7,274,051 | B2 | 9/2007 | Kim et al. |
| 2005/0079659 | A1 | 4/2005 | Duan et al. |
| 2005/0164432 | A1 | 7/2005 | Lieber et al. |
| 2005/0253137 | A1 | 11/2005 | Whang et al. |
| 2006/0008942 | A1 | 1/2006 | Romano et al. |
| 2006/0284181 | A1 | 12/2006 | Chae et al. |

FOREIGN PATENT DOCUMENTS

| JP | 62-290155 | 12/1987 |
| JP | 2002-075907 | 3/2002 |
| JP | 2006-80519 | 3/2006 |
| WO | WO 2004/032191 A2 | 4/2004 |
| WO | WO 2004/111319 A2 | 12/2004 |

OTHER PUBLICATIONS

Duan, et al., "High-performance thin-film transistors using semiconductor nanowires and nanoribbons", Nature, Sep. 18, 2003, pp. 274-278, vol. 425, Nature Publishing Group.
Sharma, S. et al., "Diameter control of Ti-catalyzed silicon nanowires", Apr. 20, 2004, pp. 613-618, 267, Journal of Crystal Growth.

(Continued)

*Primary Examiner* — Seahvosh Nikmanesh
(74) *Attorney, Agent, or Firm* — McDermott Will & Emery LLP

(57) ABSTRACT

A nanowire transistor according to the present invention includes: at least one nanowire 13 including a core portion 13a that functions as a channel region and an insulating shell portion 13b that covers the surface of the core portion 13a; source and drain electrodes 14 and 15, which are connected to the nanowire 13; and a gate electrode 21 for controlling conductivity in at least a part of the core portion 13a of the nanowire 13. The core portion 13a is made of semiconductor single crystals including Si and has a cross section with a curved profile on a plane that intersects with the longitudinal axis thereof. The insulating shell portion 13b is made of an insulator including Si and functions as at least a portion of a gate insulating film.

3 Claims, 20 Drawing Sheets

(a)

(b)

OTHER PUBLICATIONS

Japanese Office Action, w/ English translation thereof, issued in Japanese Patent Application No. 2007-072887, dated Oct. 4, 2011.
Voler Schmidt et al., "Diameter-Dependent Growth Direction of Epitaxial Silicon Nanowires," Nano Letters, vol. 5, No. 5, 2005, pp. 931-935.
Yufeng Zhao et al., "What is the Ground-State Structure of the Thinnest Si Nanowires?" Physical Review Letters, Jul. 17, 2003, vol. 91, No. 3, 035501-1 to 035501-4.
Japanese Notice of Reasons for Rejection, w/ English translation thereof, issued in Japanese Patent Application No. 2007-072887, mailed Dec. 27, 2011.

(a)

(b)

(a)

(b)

(a)

(b)

(a)

(b)

(c)

(a)

(b)

(a)

(b)

(a)

(b)

(a)

(b)

(a)

(b)

(c)

(a)

Gate Insulating Film (b)

Gate Insulating Film (c)

Gate Insulating Film

NANOWIRE TRANSISTOR AND METHOD FOR FABRICATING THE SAME

RELATED APPLICATIONS

This application is a Divisional of U.S. application Ser. No. 11/729,949, filed on Mar. 30, 2007 now abandoned, claiming priority of Japanese Patent Application No. 2006-093760, filed on Mar. 30, 2006, the entire contents of each of which are hereby incorporated by reference.

BACKGROUND OF THE INVENTION

1. Field of the Invention

The present invention relates to a nanowire transistor and a method for fabricating such a transistor. More particularly, the present invention relates to a transistor including a nanowire with a core-shell structure, in which a semiconductor core portion is coated with a gate insulating film. Such a nanowire transistor can be used in an electronic device or a micro device to be fabricated on a flexible substrate using thin-film transistors.

2. Description of the Related Art

A conventional active-matrix-addressed LCD or organic electroluminescent (EL) display is formed by arranging a number of pixels in matrix on a glass substrate. Specifically, on the glass substrate, arranged are scan lines and data lines that run in columns and rows. And each pixel can be electrically connected to by way of a transistor (switching element) that is arranged near the pixel. Since a single crystalline semiconductor layer cannot be formed on a glass substrate according to any of the current techniques, a thin-film transistor (TFT), which is made of an amorphous silicon or polysilicon film that is not single crystalline, is formed on the glass substrate and used as a switching element for controlling the pixel.

Some people have proposed using a plastic substrate that is more lightweight and more flexible than a glass substrate. However, such a flexible substrate softens at a lower temperature than a glass substrate. For that reason, even the amorphous silicon or polysilicon film cannot be formed on such a flexible substrate. That is why organic semiconductor TFTs and nanowire transistors have been developed as transistor devices that can be fabricated by lower-temperature processes.

In "High Performance Thin Film Transistors Using Semiconductor Nanowires and Nanoribbons", Nature, Vol. 425, 2003, p. 274, disclosed is a nanowire transistor that uses a nanowire of a single crystalline semiconductor, not a semiconductor thin film, as the channel region of the transistor. Such a nanowire transistor may be fabricated in the following manner.

First, a substrate to produce crystal growth thereon is provided separately from a substrate for supporting transistors, silicon nanowires are grown on the former substrate, and then the silicon nanowires are removed from the crystal-growing substrate. The silicon nanowires are made of single crystalline silicon and have excellent crystallinity. To grow nanowires, a high-temperature process needs to be carried out at a temperature that is too high to withstand for a normal flexible substrate. As the crystal-growing substrate, however, a substrate that can withstand such a high-temperature process is used.

Next, a great number of silicon nanowires thus obtained are dispersed in a solution. Subsequently, the silicon nanowires, dispersed in the solution, are arranged on a flexible substrate and then electrode structures are formed thereon, thereby completing nanowire transistors on the flexible substrate. The electrode structures may also be formed at a relatively low temperature that a plastic substrate can withstand.

In the transistor fabricated by such a method, its channel region is made of single crystalline silicon. For that reason, even on a flexible substrate, the transistor realizes very high performance including an electron or hole field effect mobility or more than 100 $cm^2V^{-1}s^{-1}$.

Hereinafter, the configuration and problem of the conventional nanowire transistor will be described with reference to FIGS. 1 and 2. FIG. 1 is a perspective view illustrating a conventional nanowire transistor. FIG. 2(a) is a top view of the nanowire transistor shown in FIG. 1 and FIG. 2(b) shows a cross-sectional structure thereof as viewed on the plane A-A'.

The nanowire transistor shown in FIG. 1 includes a flexible substrate 1, a gate electrode 2 on the flexible substrate 1, a gate insulating film 4 that covers the gate electrode 2, nanowires 3 arranged on the gate insulating film, and source/drain electrodes 5 and 6.

The nanowire transistor shown in FIGS. 1 and 2 has the following problems.

Specifically, on the flexible substrate 1, the process temperature is restricted, and therefore, the gate insulating film needs to be formed at a temperature of 200° C. or less, for example. That is why the gate insulating film should be either an organic insulating film formed by a coating process or an inorganic insulating film formed by a low-temperature CVD process or a sputtering process. However, the organic insulating film and the inorganic insulating film, deposited at a low temperature, have too low breakdown voltages to achieve high reliability as a gate insulating film.

On top of that, the gate insulating film 4 formed by such a low-temperature process has increased interface levels and decreased carrier mobility in the interface between the film 4 and the channel, which is also a problem. Besides, as there are fixed charges and mobile ions in the organic insulating film, the threshold value may shift, the current-voltage characteristic may produce hysteresis, and the variation in characteristic may increase.

In order to overcome the problems described above, the present invention has an object of providing a novel transistor and a method for fabricating such a transistor. Another object of the present invention is to provide an electronic device using such a nanowire transistor.

SUMMARY OF THE INVENTION

A nanowire transistor according to the present invention includes: at least one nanowire including a core portion that functions as a channel region and an insulating shell portion that covers the surface of the core portion; source and drain electrodes, which are connected to the nanowire; and a gate electrode for controlling conductivity in at least a part of the core portion of the nanowire. The core portion is made of semiconductor single crystals including Si and has a cross section with a curved profile on a plane that intersects with the longitudinal axis thereof. The insulating shell portion is made of an insulator including Si and functions as at least a portion of a gate insulating film.

In one preferred embodiment, the cross section of the core portion has an approximately circular or elliptical profile.

In this particular preferred embodiment, the core portion has a diameter of at least 20 nm and the insulating shell portion has a thickness of at least 15 nm.

In a specific preferred embodiment, the insulating shell portion is made of either an oxide of Si or a nitride of Si.

In another preferred embodiment, the insulating shell portion is in contact with the gate electrode.

In still another preferred embodiment, an insulating layer, functioning as another portion of the gate insulating film, is arranged between the insulating shell portion and the gate electrode.

In yet another preferred embodiment, the insulating shell portion has been removed from a region where the source or drain electrode is in contact with the core portion.

In yet another preferred embodiment, the nanowire transistor further includes an insulating substrate that supports the nanowire.

In yet another preferred embodiment, a number of grooves have been cut on the gate electrode so as to extend parallel to each other from the source electrode toward the drain electrode and to receive the nanowires.

In an alternative preferred embodiment, a number of grooves have been cut on the source and drain electrodes so as to extend perpendicularly to the gate electrode and receive the nanowires.

In a specific preferred embodiment, the grooves have a V-cross section, a U-cross section or a rectangular cross section as viewed on a plane that intersects with the longitudinal axis of the grooves.

In yet another preferred embodiment, the substrate is made of a polymer material, or a compound of a polymer material and an inorganic material.

An electronic circuit according to the present invention is characterized by including the nanowire transistor described above.

A display panel according to the present invention is characterized by including the electronic circuit described above.

A display device according to the present invention is characterized by including the display panel described above.

A method for fabricating a nanowire transistor according to the present invention includes the steps of: providing at least one nanowire including a core portion that functions as a channel region and an insulating shell portion that covers the surface of the core portion; and forming source and drain electrodes to be connected to the nanowire and also forming a gate electrode for controlling conductivity in at least a part of the core portion of the nanowire. The step of providing the nanowire includes the steps of: forming a nanowire material, which is made of semiconductor single crystals including Si and which has a polygonal cross section on a plane that intersects with the longitudinal axis thereof, by a crystal growing process; and thermally oxidizing the surface of the nanowire material to form the insulating shell portion on the surface. The step of thermally oxidizing includes thermally oxidizing the surface of the nanowire material such that a cross section that intersects with the longitudinal axis of the core portion has a curved profile.

In one preferred embodiment, the nanowire material has a diameter of at least 35 nm, and the step of thermally oxidizing includes thermally oxidizing the surface until the insulating shell portion has a thickness of 15 nm or more.

The nanowire transistor of the present invention uses a nanowire with a core-shell structure, which has been formed separately from the substrate that supports the transistor. In addition, the shell portion is made of an insulator that can achieve high reliability as a gate insulating film. Particularly, according to the present invention, although the core portion is made of a single crystalline semiconductor, a cross section thereof that intersects with the longitudinal axis thereof has a curved profile. Consequently, the interface between the gate insulating film and the semiconductor core portion has an improved property. Besides, no matter where the nanowire is arranged with respect to the gate electrode, a conductive channel is always formed in the core portion with good stability. As a result, the reliability of the transistor improves.

A method for fabricating a nanowire transistor according to the present invention makes it possible to form a gate insulating film of quality without being restricted by the softening temperature of a flexible substrate. As a result, nanowire transistors with a reduced variation in performance can be integrated together on the flexible substrate.

BRIEF DESCRIPTION OF THE DRAWINGS

FIGS. 11(a) and 10(b) illustrate alternative manufacturing process steps according to the second preferred embodiment of the present invention.

DETAILED DESCRIPTION OF PREFERRED EMBODIMENTS

A nanowire transistor according to the present invention includes at least one nanowire including a core portion that functions as a channel region and an insulating shell portion that covers the surface of the core portion. The core portion is made of semiconductor single crystals including Si and has a cross section with a curved profile on a plane that intersects with the longitudinal axis thereof. The insulating shell portion is made of an insulator including Si and functions as at least a portion of a gate insulating film.

Figure 20:
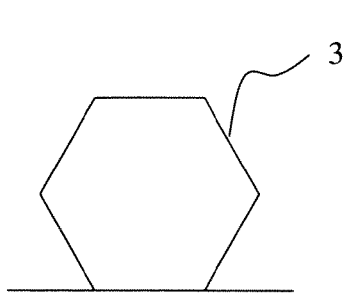
FIGS. 20(*a*) and 20(*b*) illustrate cross sections of those nanowires that are arranged on a gate insulating film and FIG. 20(*c*) illustrates a cross section of a nanowire according to the present invention that is arranged on the gate insulating film.
Figure 20:
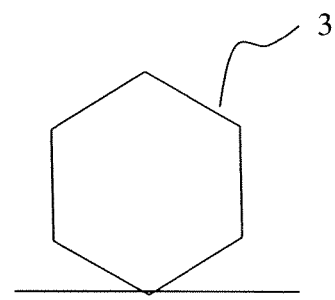
Figure 20:
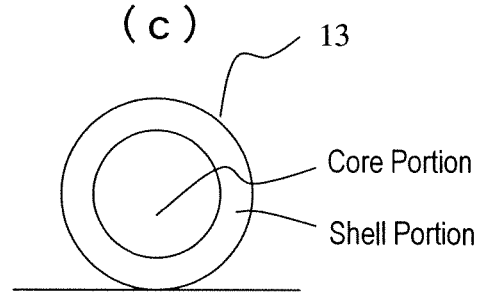

A nanowire, made of semiconductor single crystals including Si, usually has a polygonal (typically, regular hexagonal) cross section. FIGS. 20(*a*) and 20(*b*) show cross sections of such nanowires 3 that are arranged on a gate insulating film.

Specifically, in the arrangement example shown in FIG. 20(*a*), one of the six crystal facets that appear on the surfaces of the nanowire 3 is in contact with the surface of the gate insulating film. On the other hand, in the arrangement example shown in FIG. 20(*b*), none of the crystal facets appearing on the surface of the nanowire 3 is in contact with the surface of the gate insulating film. The nanowire 3 extends in the longitudinal direction but does not run quite straight but may sometimes be curved. For that reason, in many cases, the nanowire 3 is arranged as shown in FIG. 20(*b*). If a number of nanowires are actually arranged on the gate insulating film, various arrangements, including those shown in FIGS. 20(*a*) and 20(*b*), are observed.

The present inventors discovered via experiments that a big difference was made in the transistor characteristic depending on which of the two arrangements shown in FIGS. 20(*a*) and 20(*b*) was adopted. This is probably because the gate electric field produced on the nanowire would change according to the arrangement of the nanowire 3 with respect to the gate insulating film.

On the other hand, the nanowire of the present invention typically has a cross section such as that of the nanowire 13 shown in FIG. 20(*c*). As a result, the gate electric field produced on the gate interface can be more uniform and excellent transistor characteristic is realized, no matter how the nanowire 13 is arranged.

Since the surfaces of a single crystal nanowire should be particular crystallographic planes, the nanowire should have a cross section consisting of lines. Even if the surfaces of such a nanowire were thermally oxidized, the resultant cross-sectional shape of the nanowire would not change significantly as long as the thermal oxide film has a normal thickness. However, the present inventors discovered and confirmed via experiments that when a single crystal nanowire with a relatively large diameter was provided and had its surfaces thermally oxidized to form a relatively thick thermal oxide film thereon, the core portion of the single crystal semiconductor had a curved profile with no linear portions. If the core portion had such a curved profile, the problems that have already been described with reference to FIGS. 20(*a*) and 20(*b*) would not occur and the transistor characteristic would improve.

We also discovered that when the thermal oxide film was sufficiently thick, the interface between the semiconductor core portion and the insulating shell portion (i.e., the thermal oxide film) had such a good property as to reduce the OFF-state current of the transistor.

Embodiment 1

Hereinafter, a first preferred embodiment of a nanowire transistor according to the present invention will be described.

First, an example of a core-shell nanowire for use in the nanowire transistor of this preferred embodiment will be described with reference to FIGS. 3(*a*) and 3(*b*), which are a perspective view of a core-shell nanowire 13 and a cross-sectional view thereof as viewed on the plane B-B' shown in FIG. 3(*a*).

Figure 3:
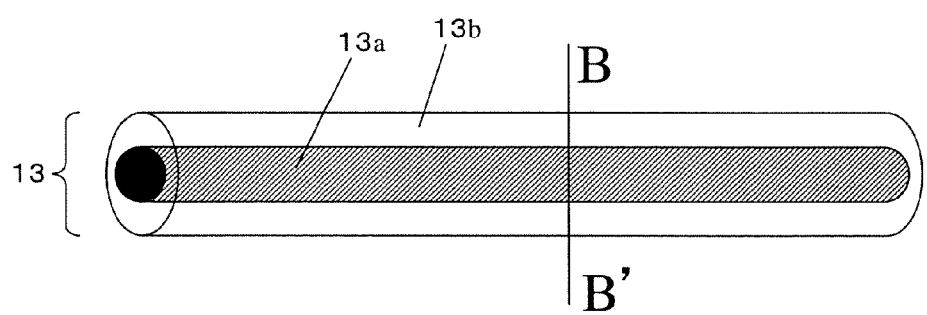
FIG. 3(a) is a perspective view of a core-shell nanowire 13 and FIG. 3(b) is a cross-sectional view thereof as viewed on the plane B-B' shown in FIG. 3(a).
Figure 3:
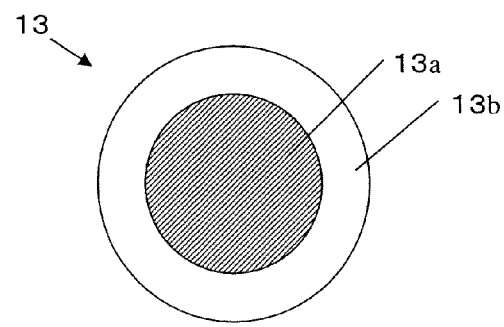

As shown in FIG. 3, the core-shell nanowire 13 includes a semiconductor core portion 13a and an insulating shell portion 13b that coats the core portion 13a. The semiconductor core portion 13a is made of a Group V semiconductor including Si such as Si or SiGe. On the other hand, the insulating shell portion 13b is made of an insulator such as silicon dioxide or silicon oxynitride.

The core-shell nanowire 13 has a length of about 1 µm to about 100 µm. The semiconductor core portion 13a may have a diameter of about 2 nm to about 1 µm, preferably about 20 nm to about 100 nm. This diameter range is preferred for the following reasons. Specifically, if the diameter of the semiconductor core portion 13a were smaller than 20 nm, quantum effect would be produced to possibly affect the stability of the characteristic. The insulating shell portion 13b has a thickness of about 5 nm to about 1 µm, preferably about 15 nm to about 100 nm.

In this preferred embodiment, the core portion 13a of the core-shell nanowire 13 is made of single crystalline silicon and the shell portion 13b thereof is made of silicon dioxide. This shell portion 13b is obtained by thermally oxidizing the surface of the silicon nanowire within an oxidizing atmosphere.

Since a voltage of 10 to 15 V is applied to the gate electrode of a transistor for driving an organic EL display, a gate insulating film with a breakdown voltage of at least 10-15 V should be formed. For example, supposing the maximum gate voltage applicable is 10 V and the silicon dioxide film had a dielectric breakdown field strength is 6 MV/cm, the silicon dioxide film should have a thickness of at least 17 nm. On the other hand, if the gate voltage is 15 V, then the silicon dioxide film should have a thickness of at least 25 nm. To allow the nanowire transistor a greater operating margin, the gate insulating film is preferably designed to have a thickness falling within an even broader range.

Even before being thermally oxidized as described above, the surface of the silicon nanowire has a natural oxide film ($SiO_x$) with a thickness of about 1 to 3 nm, which has been produced due to reaction with oxygen in the air. However, such a natural oxide film is too thin to realize the breakdown voltage that the gate insulating film of a transistor should eventually have. What is more, the natural oxide film does not have a silicon-oxygen atomic ratio of one to two. As some impurities should have entered the film from the air, the natural oxide film has a low dielectric breakdown voltage and does not form a good interface with respect to silicon, either. For these reasons, it is not preferable to make the natural oxide film function as a gate insulating film.

Hereinafter, a nanowire transistor that uses the core-shell nanowires 13 described above will be described with reference to FIGS. 4(a) and 4(b), which are a top view schematically illustrating the configuration of a nanowire transistor according to a preferred embodiment of the present invention and a cross-sectional view thereof as viewed on the plane C-C', respectively.

Figure 4:
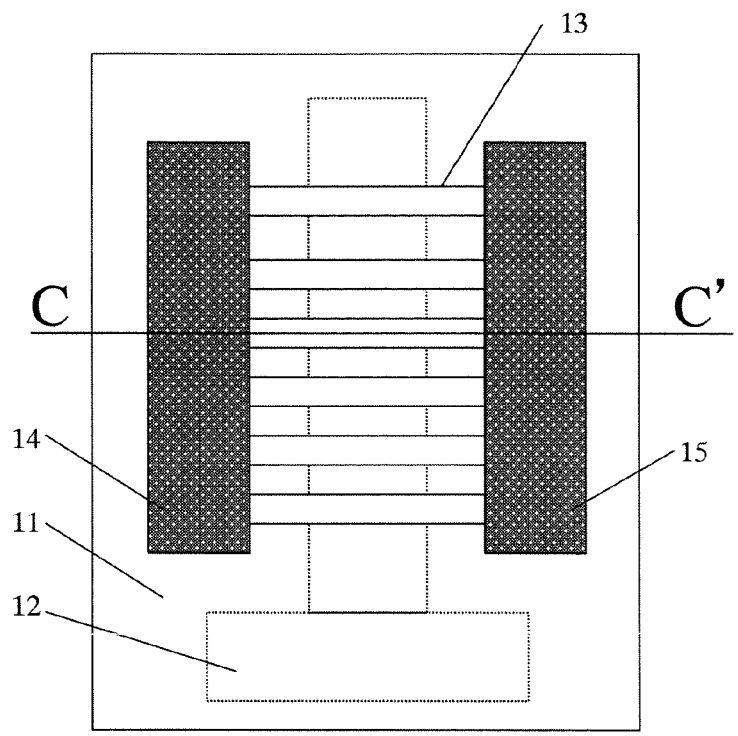
FIG. 4(a) is a top view schematically illustrating the configuration of a nanowire transistor according to a preferred embodiment of the present invention and FIG. 4(b) is a cross-sectional view thereof as viewed on the plane C-C'.
Figure 4:
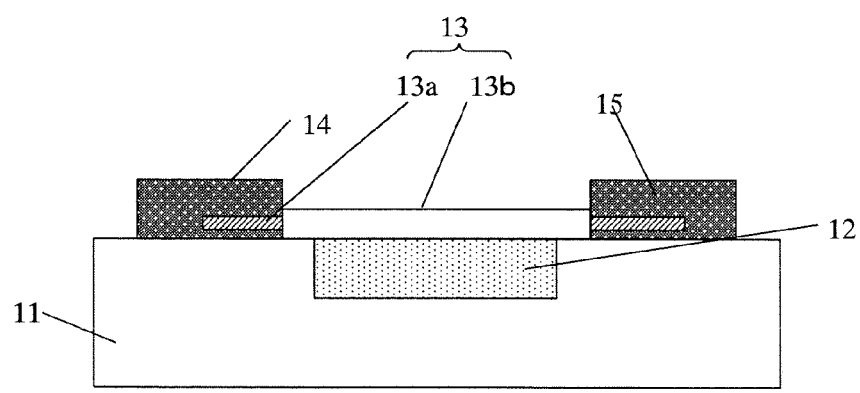

The nanowire transistor shown in FIG. 4 includes source/drain electrodes 14 and 15, which make an electrical contact with the core portion 13a of the core-shell nanowires 13, and a plastic substrate 11 that supports these members.

To electrically connect the core-shell nanowires 13 to the source/drain electrodes 14 and 15, at least a portion of the source/drain electrodes 14 and 15 preferably makes an electrical contact with the nanowires 13 where the semiconductor core portion 13a is exposed.

In this preferred embodiment, a gate electrode 12 has been formed on the upper surface of the plastic substrate 11, and the core-shell nanowires 13 are arranged on the gate electrode 12. That is to say, this transistor has a bottom-gate structure. No gate insulating film but the shell portion is provided on the gate electrode 12. In this preferred embodiment, the insulating shell portion of the core-shell nanowires 13 functions as a gate insulating film. The surface of the plastic substrate 11 has an electrically insulating property to insulate the gate electrode 12 from the source/drain electrodes 14, 15.

The plastic substrate 11 is preferably made of a material including polyimide or an aromatic ester. The gate electrode 12, source electrode 14 and drain electrode 15 are preferably made of a metallic material such as titanium, gold, aluminum or nickel.

When a gate voltage is applied to the gate electrode 12, the conductivity in the channel region of the core portion 13a is controlled by way of the shell portion (silicon dioxide film) 13b of the core-shell nanowires 13.

In this preferred embodiment, the core portion 13a of the core-shell nanowires 13 is made of silicon and the shell portion 13b thereof is made of silicon dioxide, which is made to function as the gate insulating film of the nanowire transistor. As a result, a nanowire transistor, which has a high breakdown voltage and which has reduced interface levels in the interface between the channel and the gate insulating film and reduced fixed charges in the insulating film, is realized. Consequently, a high-reliability and high-mobility nanowire transistor is realized on the plastic substrate.

In the nanowire transistor shown in FIG. 4, the multiple core-shell nanowires 13 are all arranged parallel to the line C-C'. In an actual transistor, however, those core-shell nanowires 13 may cross each other or may be arranged non-parallel to the line C-C'.

Hereinafter, a preferred method of making the core-shell nanowire of this preferred embodiment will be described.

First, a nanowire material is prepared. Specifically, metal fine particles to be a catalyst are put on an arbitrary substrate. As the catalyst metal, cobalt, nickel, gold, or platinum may be used, for example. This catalyst metal may be put on the substrate by depositing a thin film to a thickness of about 1-10 nm by a sputtering process or an evaporation process and then thermally treating the thin film within an arbitrary atmosphere and turning the thin film into metal fine particles. Alternatively, a colloid of metal fine particles may be applied on the substrate.

Next, nanowires are grown on the substrate by a CVD process. Silicon nanowires may be grown by using silane or disilane as a source gas and heating the substrate to a temperature of about 400-600° C. After that, the substrate on which the silicon nanowires have grown is loaded into an oxidation processing chamber and then subjected to an oxidation process. In this manner, core-shell nanowires, of which the semiconductor core portion 13a is coated the insulating shell portion 13b, can be obtained.

Figure 5:
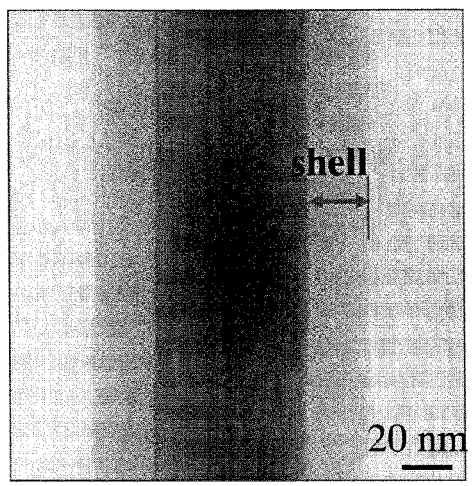
FIGS. 5(a) and 5(b) are cross-sectional TEM photographs of a core-shell nanowire as viewed parallel to a plane that includes the center axis thereof.
FIG. 5(c) is a graph showing how the thickness of a shell portion (of $SiO_2$) changes with the oxidation process time.
Figure 5:
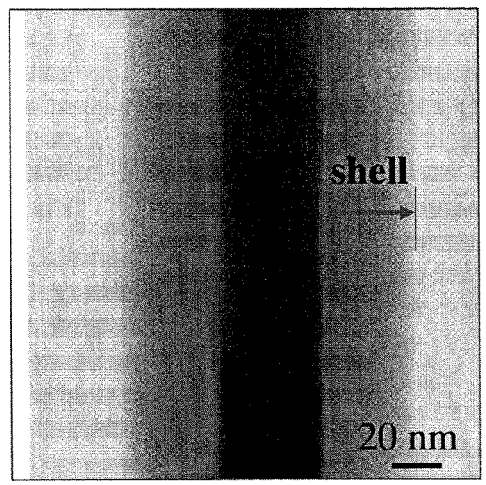
Figure 5:
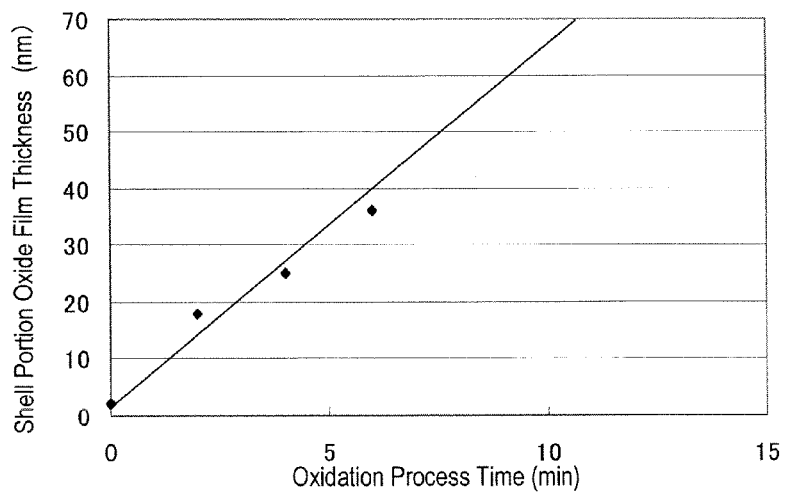

FIGS. 5(a) and 5(b) are cross-sectional TEM photographs of a core-shell nanowire as viewed parallel to a plane that includes the center axis (i.e., longitudinal axis) thereof, and FIG. 5(c) is a graph showing how the thickness of a shell portion (of $SiO_2$) changes with the oxidation process time. Specifically, FIG. 5(a) shows a TEM photograph of a nanowire that was subjected to the oxidation process for two minutes, while FIG. 5(b) shows a TEM photograph of a nanowire that was subjected to the oxidation process for six minutes.

The nanowire material (silicon nanowire) yet to be oxidized had a diameter of approximately 60 nm. A nanowire with a diameter of 50 nm to 150 nm, for example, which is greater than that of conventional nanowires (which may be about 10 nm to about 20 nm), is provided and has its surface thermally oxidized, thereby forming a relatively thick thermal oxide film to a thickness of 15 nm or more.

The thickness and film quality of the silicon dioxide film depend on the process time, temperature and atmosphere of the oxidation process. That is why the conditions of the thermal oxidation are set according to the specifications of the transistors to be formed. In this preferred embodiment, a thermal oxide film was formed by performing a rapid thermal process within an oxygen atmosphere at 1,100° C. As can be seen from FIG. 5(c), as the oxidation process time increases, the thickness of the oxide film on the shell portion increases proportionally.

Figure 6:
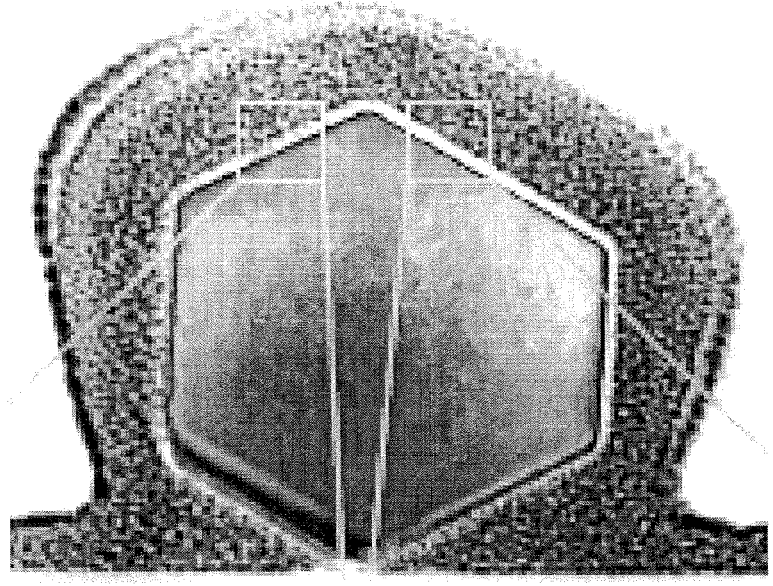
FIG. 6(a) is a cross-sectional TEM photograph as viewed parallel to a plane that crosses, at right angles, the center axis (or the longitudinal axis) of the nanowire yet to be thermally oxidized.
FIG. 6(b) is a cross-sectional TEM photograph as viewed parallel to a plane that crosses, at right angles, the center axis (or the longitudinal axis) of the thermally oxidized nanowire.
Figure 6:
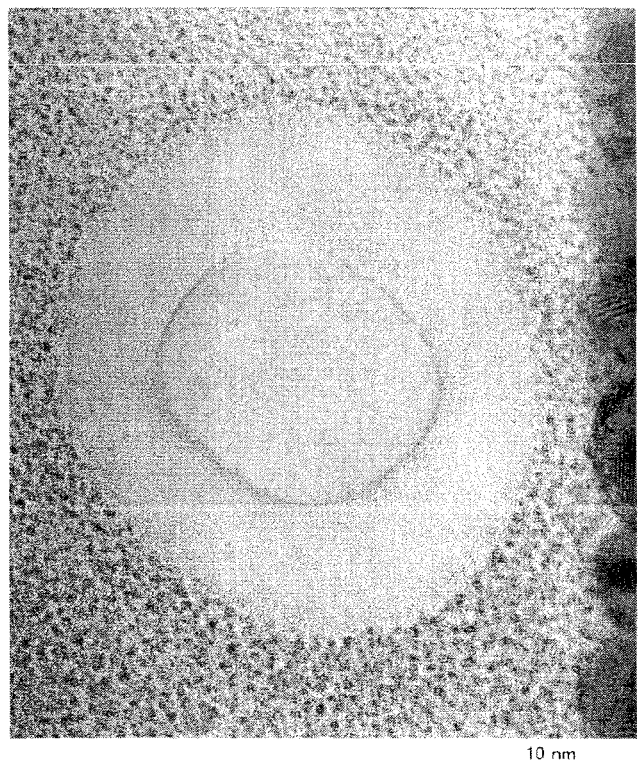

FIG. 6(a) is a cross-sectional TEM photograph as viewed on a plane that crosses, at right angles, the center axis (or the longitudinal axis) of the nanowire yet to be thermally oxidized. As can be seen easily from FIG. 6(a), the core portion has a polygonal (e.g., hexagonal in this case) cross section, which means that facets reflecting the crystal structure of silicon single crystals are exposed on the surface of the nanowire. On the other hand, FIG. 6(b) is a cross-sectional TEM photograph as viewed on a plane that crosses, at right angles, the center axis (or the longitudinal axis) of a core-shell nanowire that was thermally oxidized at 1,100° C. for four minutes within an atmosphere with an oxygen flow rate of 6 litters per minute. As is clear from FIG. 6(b), the core section has a cross section with a curved (i.e., substantially circular or elliptical) profile. It should be noted that the oxidation rate has dependence on the crystallographic plane orientations. That is why if the nanowire yet to be thermally oxidized had a regular hexagonal cross section, the oxidation would advance anisotropically from the peripheral portion, and therefore, the core portion would never have a completely round cross section but would often have an approximately elliptical cross section. As used herein, the "curved" profile includes substantially no linear portions with an infinite radius of curvature but has radii of curvature that do not change significantly from one point to another.

As described above, even in a situation where the silicon crystal nanowire material yet to be thermally oxidized has a polygonal cross section, if a thermal oxide film is formed on its surface to a thickness of 15 nm or more, the interface between the silicon crystals and the thermal oxide film gradually forms a curved profile as the oxidation advances. It is not clear at this time exactly how the polygonal cross section changes into such a shape. As the thermal oxidation advances, the core portion 13a has a gradually decreasing diameter. However, the core portion 13a of the core-shell nanowire 13 to be eventually used in the transistor preferably has a diameter of at least 5 nm.

Generally speaking, in arranging a core-shell nanowire 13 on the gate electrode 12, it is difficult to control the direction of the core-shell nanowire 13 such that a predetermined portion of the nanowire 13 faces the gate electrode 12. That is why if the core portion 13a has a polygonal cross section, it is not easy to always position a particular side or vertex of the polygon closest to the gate electrode 12. When a voltage is applied to the gate electrode 12 after the transistor is completed, a conductive channel will be formed in a part of the core portion 13a that is located closest to the gate electrode 12. For that reason, if the core portion 13a has a polygonal cross section, the transistor performance may vary according to the angle of rotation of the core-shell nanowire 13. In the core-shell nanowire 13 of this preferred embodiment, however, the core portion 13a has a cross section with a curved profile, thus overcoming such a problem. In view of this consideration, the core portion 13a preferably has a cross section with a circular or elliptical profile.

Optionally, a quality insulating shell portion 13b can also be formed by performing a nitrifying process either after, or instead of, the thermal oxidation process. When a silicon nanowire material is used as is done in this preferred embodiment, a nanowire coated with a silicon oxynitride film or a silicon nitride film can be formed by performing a nitrifying process.

Next, the core-shell nanowires 13 obtained by the method described above are dispersed in a solvent. More specifically, the core-shell nanowires 13 are stripped from the substrate (not shown) on which the nanowires 13 have grown and then dispersed in a solution. Examples of methods of stripping the core-shell nanowires 13 from the substrate include mechanically stripping the nanowires by subjecting the substrate to ultrasonic vibrations and stripping the nanowires by thinly etching the surface of the substrate. As a solvent for the dispersant, an aqueous solution, an organic solvent or a mixture of water and an organic solvent may be used. Examples of organic solvents include alcohols such as ethanol, propanol, pentanol, hexanol, and ethyleneglycol, esters such as ethyleneglycolmonoethylether, ketones such as methylethylketone, alkanes such as hexane and octane, and solvents such as tetrahydrofuran and chloroform. As a mixture of water and an organic solvent, a mixture of water and alcohol and a mixture of water and tetrahydrofuran may be used.

Hereinafter, a method for fabricating a transistor according to this preferred embodiment will be described with reference to FIGS. 7A through 7F.

Figure 7A:
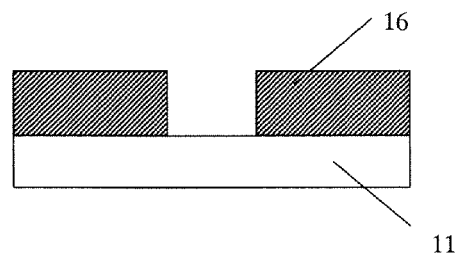
FIGS. 7A, 7B, 7C, 7D, 7E and 7F show respective process steps of a manufacturing process according to a first preferred embodiment of the present invention.
Figure 7A:
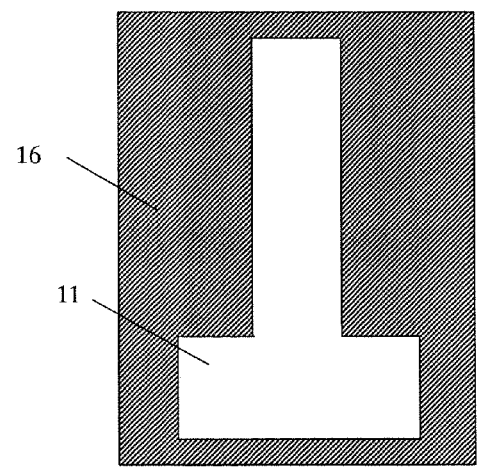

First, as shown in FIG. 7A, a resist mask layer 16 is formed by a photolithographic process on a plastic substrate 11. The resist mask layer 16 has an opening that defines the shape and location of the gate electrode 12. Instead of forming the resist mask layer 16 by a photolithographic process, another mask member formed by an inkjet process may also be used.

Figure 7B:
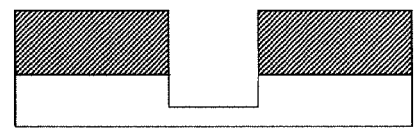
Figure 7B:
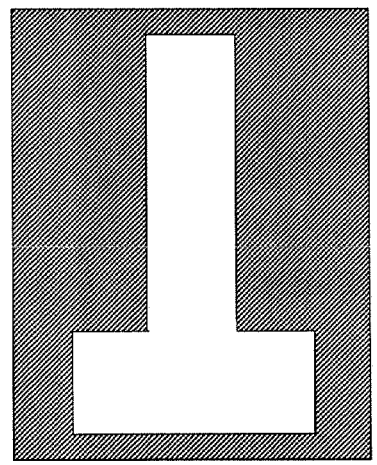

Next, as shown in FIG. 7B, a portion of the upper surface of the plastic substrate 11, which is not covered with the resist mask layer 16, is etched away, thereby making a recess there. The plastic substrate 11 may be etched by a reactive ion etching process using $CF_4$ gas or oxygen gas. However, such a recess does not have to be formed by a dry etching process but may also be formed by a wet etching process or a combination of dry and wet etching processes. In this preferred embodiment, the depth of the recess is adjusted to about 100 nm to about 300 nm.

Figure 7C:
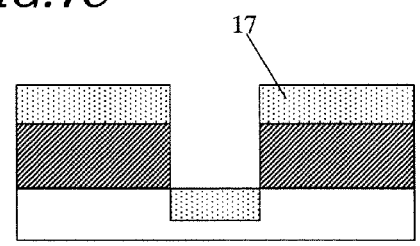
Figure 7C:
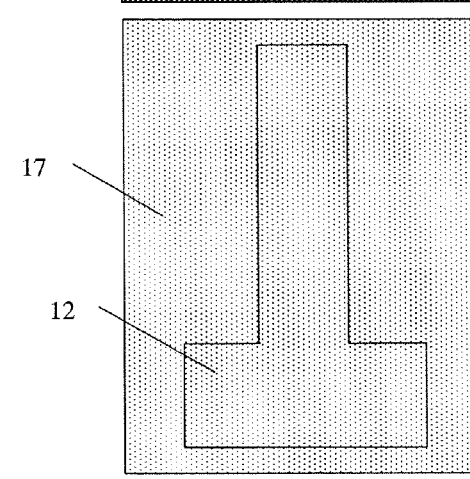

Subsequently, as shown in FIG. 7C, a gate metal 17 is deposited by a sputtering process, for example, on the plastic substrate 11. The gate metal 17 may be an aluminum film with a thickness of about 100 nm to about 300 nm, for instance. The gate metal 17 does not have to be deposited by a sputtering process but may also be deposited by an evaporation process or a metal fine particle ink application process.

Figure 7D:
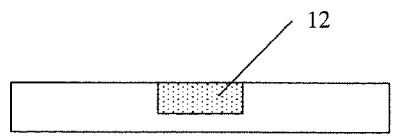
Figure 7D:
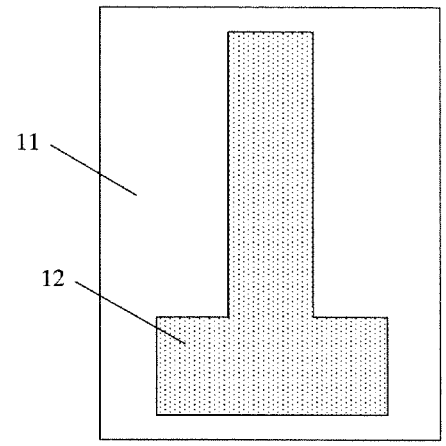

Thereafter, as shown in FIG. 7D, the gate metal 17 and resist mask layer 16 are removed from the plastic substrate 11. Specifically, the resist mask layer 16 is dissolved with an organic resist stripper and the excessive portion of the gate metal 17 that has been deposited on the resist mask layer 16 is also lifted off with the resist mask layer 16. In this manner, a gate electrode 12 with a predetermined pattern is made of the gate metal 17. In this preferred embodiment, the thickness of the gate metal 17 is set approximately equal to the depth of the recess where the gate electrode will eventually be located, thereby leveling the respective upper surfaces of the gate electrode 12 and plastic substrate 11 with each other and making no big level differences on the surface of the plastic substrate 11.

Figure 7E:
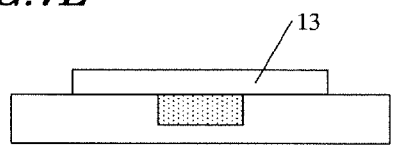
Figure 7E:
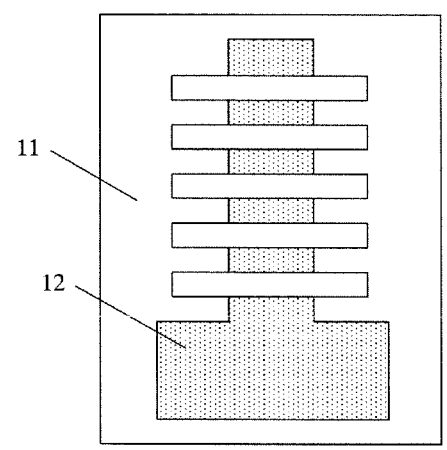

Next, as shown in FIG. 7E, a number of core-shell nanowires 13 are arranged on the gate electrode 12. The core-shell nanowires 13 may be arranged by utilizing the flow of a liquid, transferring the core-shell nanowires 13 or by controlling the surface energy of the core-shell nanowires 13. In this preferred embodiment, a mold (not shown) with a plurality of grooves in a desired shape is brought into close contact with the area where the core-shell nanowires 13 should be arranged, and a solution in which the core-shell nanowires are dispersed is made to flow through those grooves (which is called a "flow process"). When such a flow process is adopted, the locations of the core-shell nanowires 13 can be controlled by changing the shapes of the mold, and the direction of the core-shell nanowires 13 can be defined by the flow of the liquid.

Figure 7F:
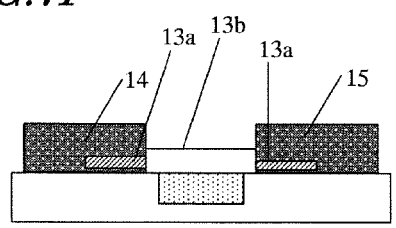
Figure 7F:
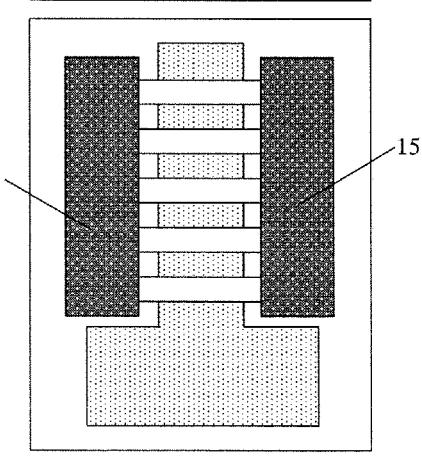

Subsequently, as shown in FIG. 7F, source/drain electrodes 14 and 15 are formed on the plastic substrate 11. More specifically, first, a resist mask layer (not shown) that has openings in areas where the source/drain electrodes 14 and 15 should be located is defined by a photolithographic process on the upper surface of the plastic substrate 11. These openings of this resist mask layer define contact areas where the source/drain electrodes 14 and 15 make an electrical contact with the core-shell nanowires 13. Parts of the insulating shell portion 13b that are located within those contact areas are etched away with a hydrofluoric acid solution, thereby exposing the core portion 13a. Thereafter, nickel, which is the material of the source/drain electrodes, is deposited by a sputtering process on the plastic substrate 11. In this case, nickel makes a direct contact with the core portion of the core-shell nanowires 13 inside the openings of the resist. And then the excessive portion of the nickel that has been deposited on the resist mask layer is lifted off with the resist mask layer itself. Alternatively, the source/drain electrodes 14 and 15 may also be formed by putting an electrode material on predetermined regions on the substrate 11 by an inkjet process.

In the manufacturing process of this preferred embodiment, before the core-shell nanowires are arranged on the flexible substrate, the nanowires have already been coated with a gate insulating film of quality. That is why nanowire transistors, of which the channel region has good characteristics, can be integrated together on the flexible substrate without being restricted by the softening temperature of the plastic substrate.

Embodiment 2

Hereinafter, a second preferred embodiment of a nanowire transistor according to the present invention will be described with reference to FIGS. 8(a) and 8(b), which are a top view schematically illustrating the configuration of a nanowire transistor according to this preferred embodiment and a cross-sectional view thereof as viewed on the plane D-D'.

Figure 8:
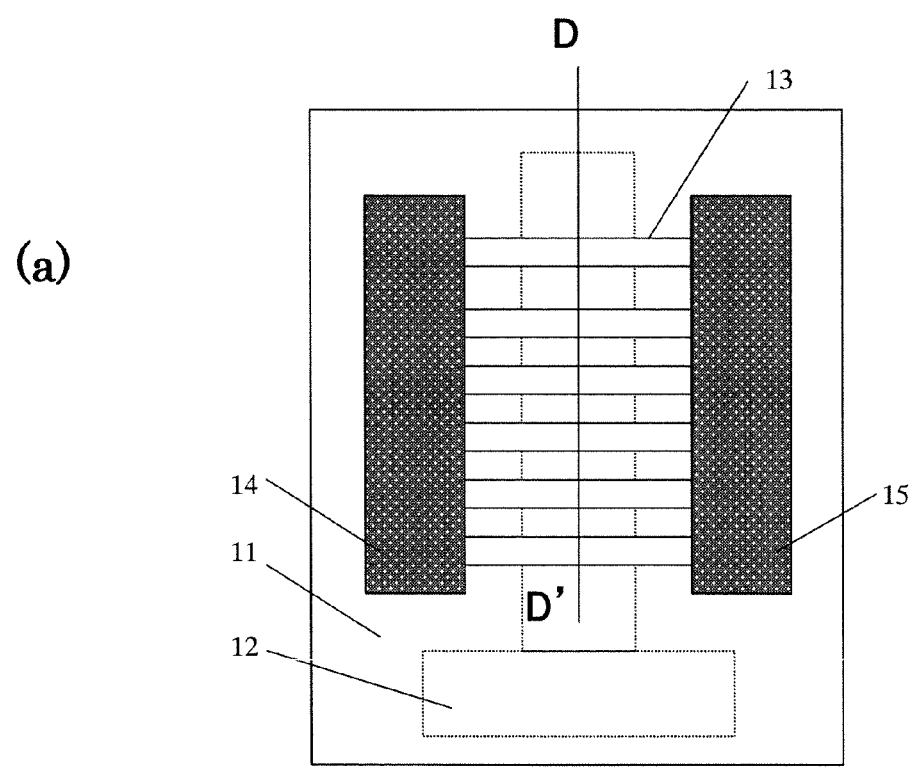
FIG. 8(a) is a top view schematically illustrating the configuration of a nanowire transistor according to the first preferred embodiment of the present invention and FIG. 8(b) is a cross-sectional view thereof as viewed on the plane D-D'.
Figure 8:
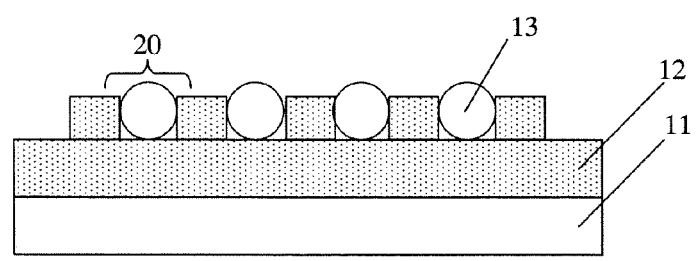

The nanowire transistor of this preferred embodiment is quite different from the counterpart of the first preferred embodiment in that the gate electrode 12 has a number of grooves 20 in which the core-shell nanowires 13 are arranged as shown in FIG. 8.

Figure 9:
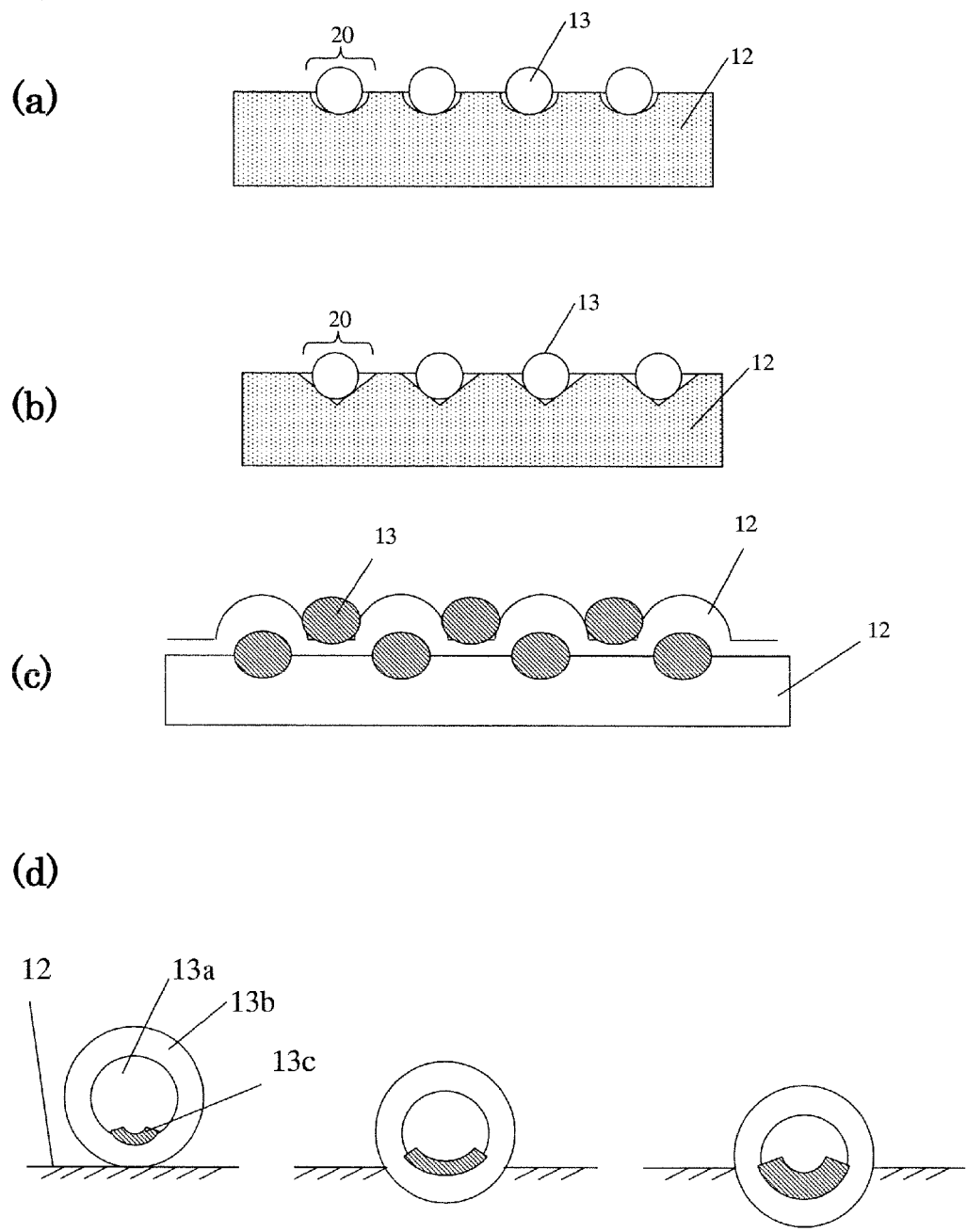
FIGS. 9(a) and 9(b) are cross-sectional views illustrating U-grooves and V-grooves, respectively.
FIG. 9(c) is a cross-sectional view illustrating another groove structure.
FIG. 9(d) is a cross-sectional view showing portions of the core-shell nanowires in which a gate electric field has an effect on the semiconductor core portions 13a in a situation where the core-shell nanowires are arranged in grooves with multiple different depths.

The grooves 20 do not have to have a rectangular cross section but may also have a V- or U-cross section as shown in FIGS. 9(a) and 9(b). Although a single core-shell nanowire 13 is put in a single groove 20 in this preferred embodiment, a single groove 20 may receive a plurality of core-shell nanowires 13 as well.

FIG. 9(c) illustrates an example with a two-layered gate electrode. In this example, after nanowires have been arranged in the grooves of the lower layer of the gate electrode, the upper layer portion of the gate electrode is formed so as to cover those nanowires. This upper layer portion of the gate electrode has an uneven surface corresponding to the unevenness of the lower layer portion and the other nanowires are arranged inside the recesses of this uneven surface.

FIG. 9(d) schematically shows portions 13c of the core-shell nanowires 13 (that will have modulated conductivity) in which a gate electric field has an effect on the semiconductor core portions 13a in a situation where the core-shell nanowires 13 are arranged in grooves with multiple different depths. As shown in FIG. 9(d), if a gate electrode 12 with grooves is used, the part of the semiconductor core portion 13a that faces the gate electrode 12 has an increased effective area compared to the situation where a flat gate electrode 12 is used. As a result, the portions 13c of the semiconductor core portions 13a that will have modulated conductivity increase their volumes. Consequently, in the nanowire transistor of this preferred embodiment, the conductivity of the channel can be modulated by the gate electrode 12 in an increased area, and therefore, a high-performance nanowire transistor with increased current drivability and increased ON-state/OFF-state current ratio is realized.

Figure 10:
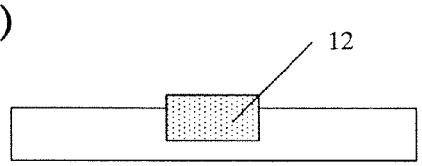
FIGS. 10(a) and 10(b) illustrate manufacturing process steps according to a second preferred embodiment of the present invention.
Figure 10:
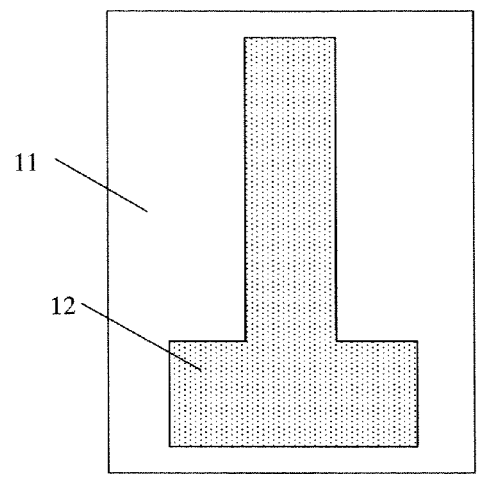
Figure 10:
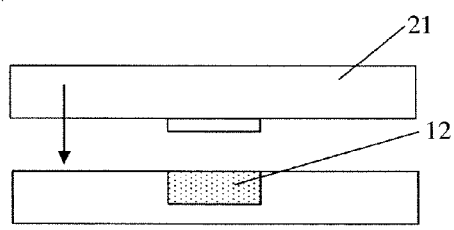
Figure 10:
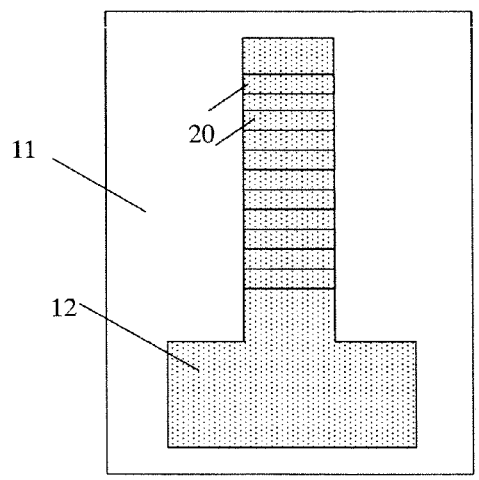
Figure 11:
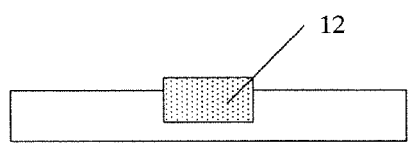
Figure 11:
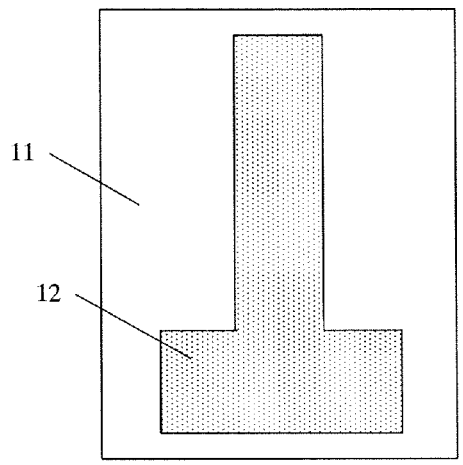
Figure 11:
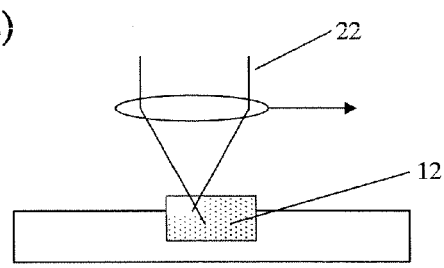
Figure 11:
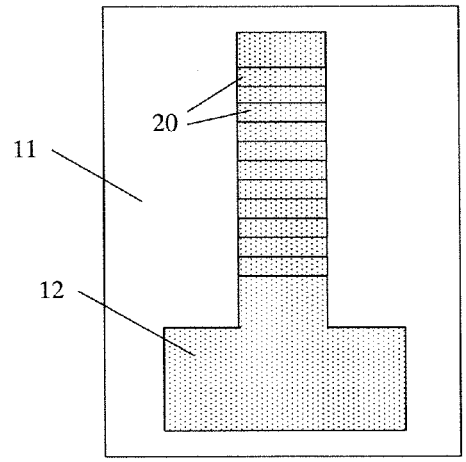

A method for fabricating a nanowire transistor according to this preferred embodiment is basically the same as that of the first preferred embodiment described above. Hereinafter, an exemplary method of cutting grooves in the gate electrode will be described with reference to FIGS. 10 and 11.

First, as shown in FIG. 10(a), a gate electrode 12 is formed on a plastic substrate 11 such that the upper surface of the gate electrode 12 becomes higher than that of the plastic substrate 11. For example, a resist mask stripped layer (not shown) may be deposited on the plastic substrate 11 and then the same process steps as those already described for the first preferred embodiment may be carried out to deposit a gate electrode material on the stripped layer and then lift the excessive material off with the stripped layer. Next, as shown in FIG. 10(b), grooves 20 are cut on the gate electrode 12 by an imprint lithographic process.

Alternatively, the grooves 20 may also be cut on the gate electrode 12 by scanning the gate electrode 12 with a laser beam 22 as shown in FIG. 11(b) after the gate electrode 12 has been formed as shown in FIG. 11(a). The laser beam 22 may be a femtosecond infrared laser beam, for example. In that case, the gate electrode may be patterned without increasing the temperature of the substrate. Still alternatively, the grooves 20 may also be cut by defining a resist layer on the gate electrode 12 and then performing a holographic exposure process and an etching process.

It should be noted that the sidewall of the grooves 20 preferably forms an integral part of the gate electrode 12. However, an insulating layer with slits may be formed on the surface of the gate electrode 12 and those slits may be used as the grooves 20, too. In that case, the sidewall of the grooves 20 is an insulator but rather good effects are still achievable by holding the core-shell nanowires 13 at fixed positions. The depth of the grooves 20 is appropriately set according to the diameter of the core-shell nanowires 13. For example, the depth of the grooves 20 may be one-tenth to five times as large as the diameter of the core-shell nanowires 13.

According to this preferred embodiment, the core-shell nanowires 13 are arranged in the grooves 20, and therefore, the core-shell nanowires 13 can be easily aligned with the grooves 20. Also by adjusting the shape and size of the grooves 20, the number of core-shell nanowires 13 to cross the gate electrode 12 can be controlled to a certain degree. As a result, the variation in characteristic between nanowire transistors can be minimized.

In the first preferred embodiment described above, the semiconductor core portion of the core-shell nanowires is made of an Si-containing Group IV semiconductor such as Si or SiGe. In this preferred embodiment, however, the semiconductor portion of the core-shell nanowires 13 does not have to be made of semiconductor crystals including Si. For example, the semiconductor core portion may be made of a Group III-V compound semiconductor such as GaAs, InP or InAs or a Group II-VI compound semiconductor such as ZnS, ZnSe or CDS. Also, the insulating shell portion may be made of an insulator such as silicon dioxide, silicon oxynitride, silicon nitride or hafnium oxide.

Embodiment 3

Hereinafter, a third preferred embodiment of a nanowire transistor according to the present invention will be described with reference to FIGS. 12(a) and 12(b), which are a top view schematically illustrating the configuration of the nanowire transistor of this preferred embodiment and a cross-sectional view thereof as viewed on the plane E-E', respectively.

Figure 12:
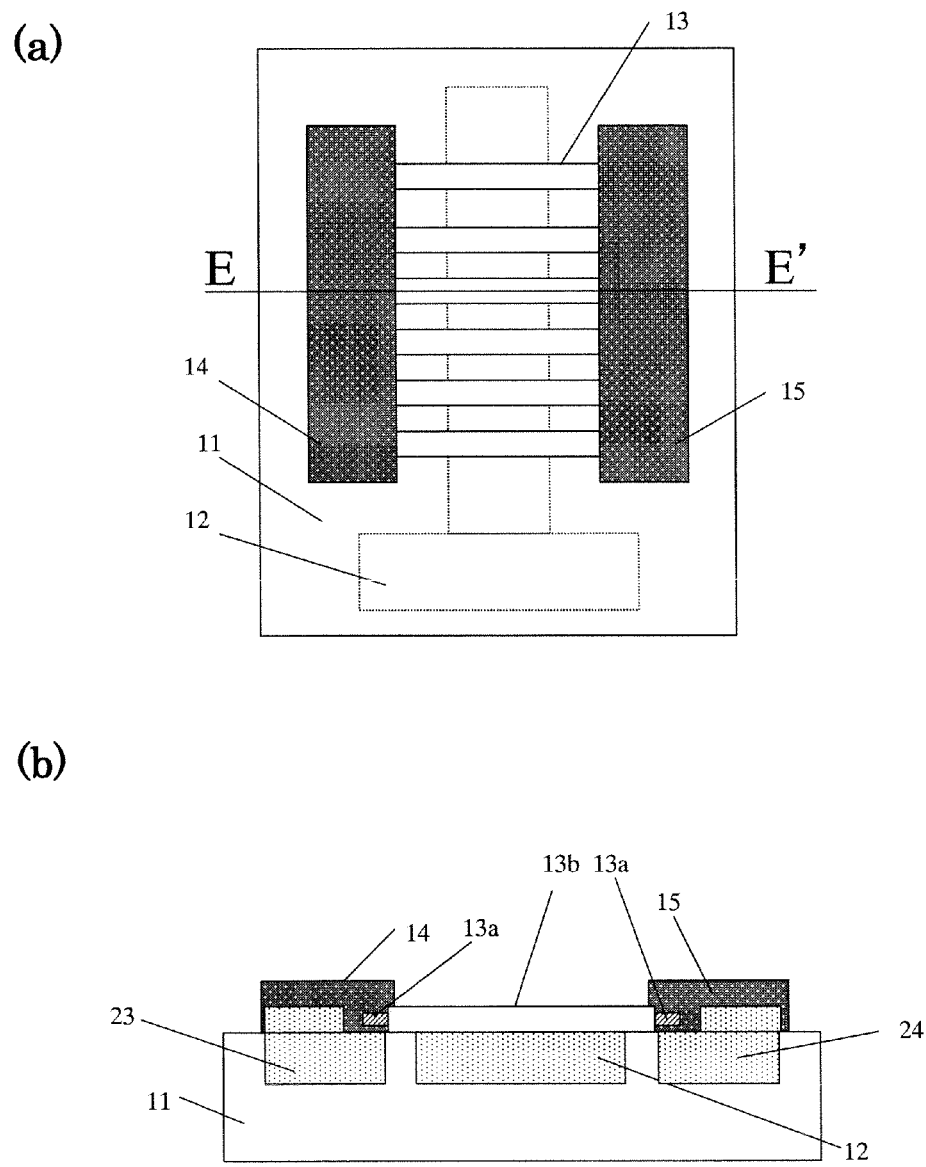
FIG. 12(a) is a top view schematically illustrating the configuration of a nanowire transistor according to a third preferred embodiment of the present invention and FIG. 12(b) is a cross-sectional view thereof as viewed on the plane E-E'.

The nanowire transistor of this preferred embodiment is quite different from the counterpart of the first preferred embodiment described above in that grooves are cut in the lower portion of the source/drain electrodes and that the core-shell nanowires are arranged inside the grooves as shown in FIG. 12.

In this preferred embodiment, buried source/drain electrodes 23 and 24 are formed in the substrate 11, a number of grooves 20 have been cut on the surface of these electrodes 23 and 24, and the core-shell nanowires 13 are arranged in the grooves 20. As already described for the second preferred embodiment, multiple core-shell nanowires 13 may be arranged in a single groove 20. Also, the grooves 20 do not have to have a rectangular cross section but may have a V- or U-cross section.

In this preferred embodiment, the source electrode consists of the buried source electrode 23 and an upper source electrode 14, while the drain electrode consists of the buried drain electrode 24 and an upper drain electrode 15. However, the key point is that the electrodes 23 and 24 located under the core-shell nanowires have grooves. That is why the buried source/drain electrodes 23 and 24 do not always have to be fully buried in the substrate 11. Optionally, the grooves 20 may be cut not only on the electrodes 23 and 24 but also on the gate electrode 12.

A nanowire transistor, of which the channel is formed by a number of core-shell nanowires 13, has an circuit configuration equivalent to that of an arrangement in which a number of transistors, each having its channel defined by a single core-shell nanowire, are connected in parallel with each other. That is why a kink may be produced depending on the shape and material property of the respective core-shell nanowires 13. In this preferred embodiment, however, core-shell nanowires 13 of the same length are arranged in the grooves 20 that have been cut on the source/drain electrodes. As a result, the kink of the nanowire transistor characteristic can be reduced.

Figure 13:
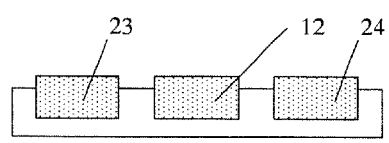
FIGS. 13(a) through 13(c) illustrate manufacturing process steps according to the third preferred embodiment.
Figure 13:
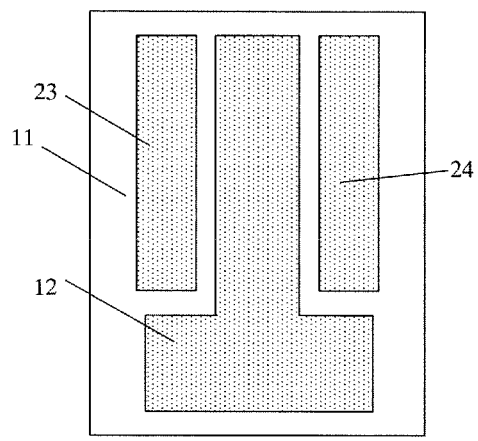
Figure 13:
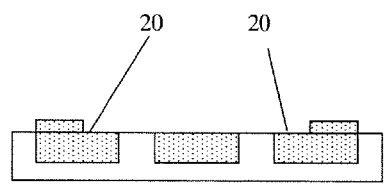
Figure 13:
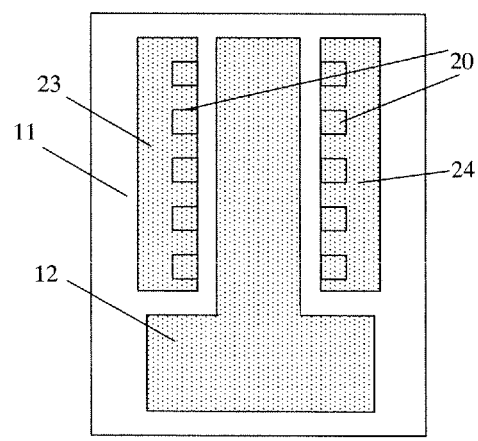
Figure 13:
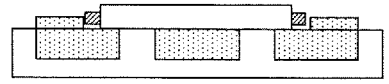
Figure 13:
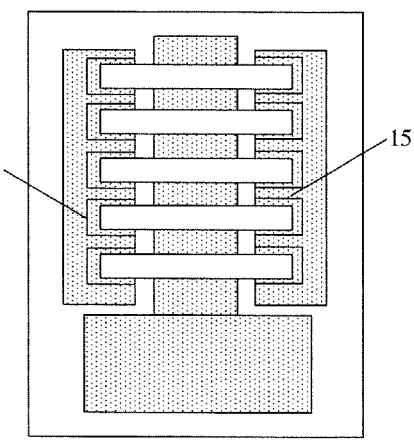

Next, a manufacturing process of this preferred embodiment will be described. This manufacturing process is basically the same as those already described for the first and second preferred embodiments. Hereinafter, a method of cutting the grooves 20 will be described with reference to FIG. 13.

First, as shown in FIG. 13(a), a gate electrode 12, a buried source electrode 23 and a buried drain electrode 24 are formed on a substrate 11 so as to protrude from the surface of the substrate 11.

Next, as shown in FIG. 13(b), grooves 20 are cut on the electrodes 23 and 24 by an imprint lithographic process. The electrode 12 is substantially leveled with the surface of the substrate 11. Subsequently, as shown in FIG. 13(c), core-shell nanowires 13 are arranged in the grooves 20 of the source/drain electrodes 23 and 24.

In the manufacturing process of this preferred embodiment, the core-shell nanowires 13 are arranged in the grooves 20, and can be easily aligned with the grooves 20. Also, by adjusting the shape of the grooves 20, the number of nanowires 13 to arrange can be controlled to a certain degree. In addition, since the grooves 20 are cut on the source/drain electrodes 23 and 24, core-shell nanowires 13 of the same length can be arranged. As a result, the variation in characteristic between the completed nanowire transistors can be minimized.

Embodiment 4

Hereinafter, a preferred embodiment of a display including the nanowire transistors of the present invention will be described with reference to FIGS. 14 and 15. The display of this preferred embodiment uses organic electroluminescent (organic EL) elements.

Figure 14:
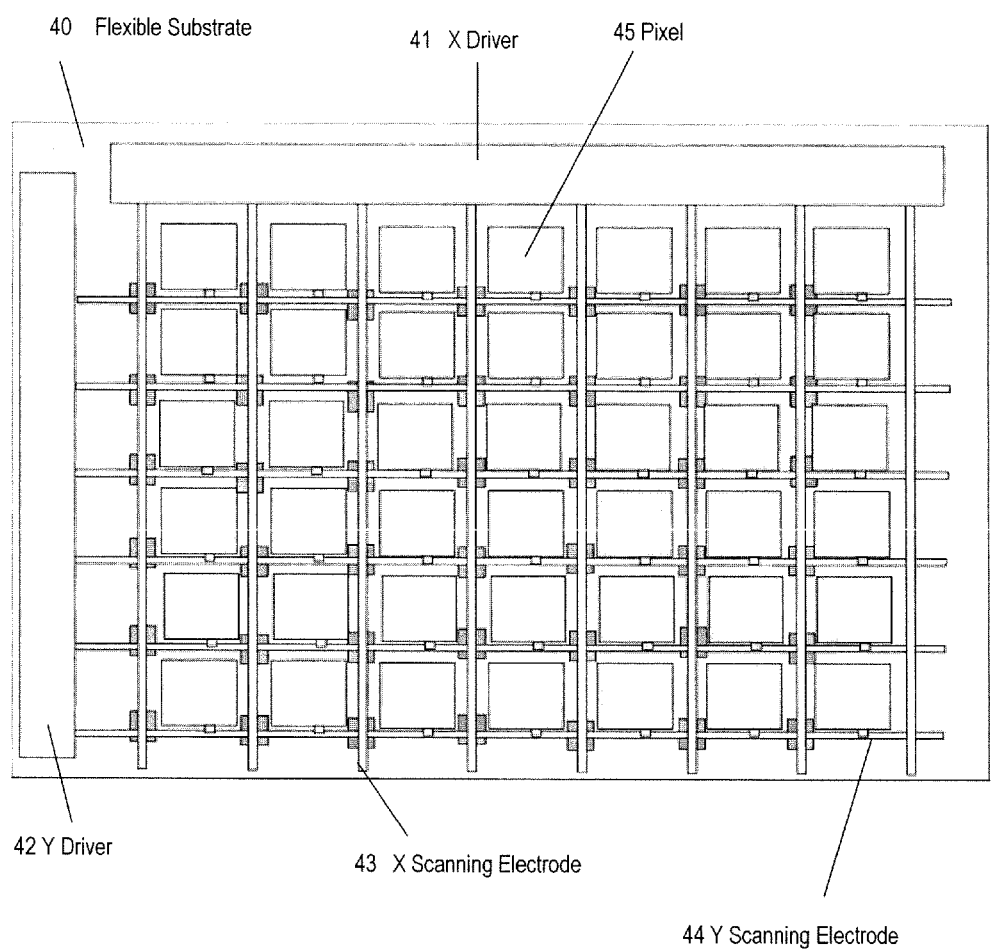
FIG. 14 is a plan view illustrating the arrangement of a display according to the present invention.
Figure 15:
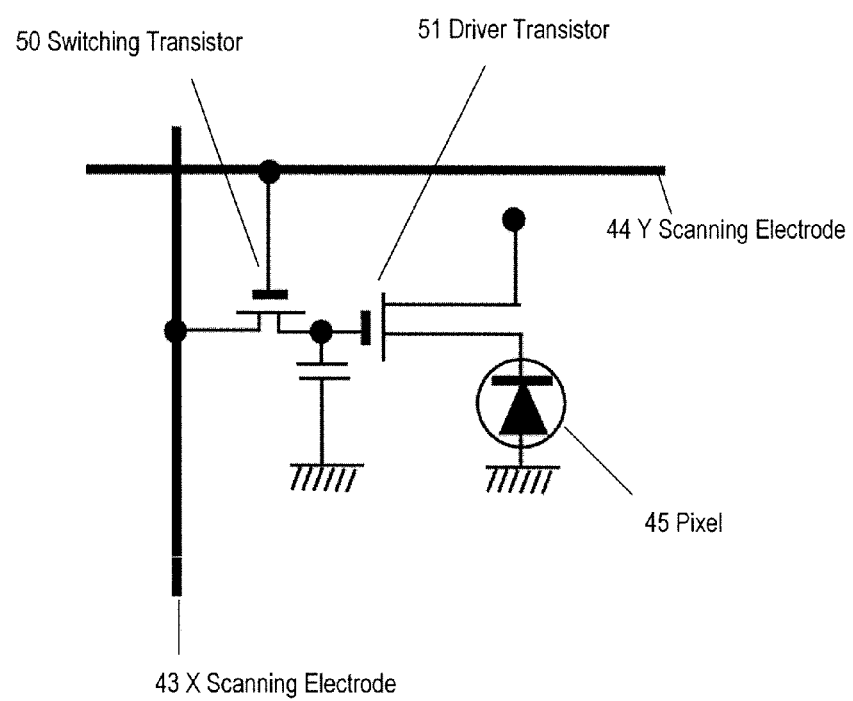
FIG. 15 is a circuit diagram of the pixel driving transistors of the display shown in FIG. 14.

FIG. 14 is a plan view schematically illustrating the arrangement of the display, while FIG. 15 is a circuit diagram showing a pixel and its surrounding members. The display shown in FIG. 14 includes a flexible substrate 40, a plurality of pixels arranged in matrix on the flexible substrate 4, an X driver 41 and a Y driver 42 to drive the respective pixels, and an X scanning electrode 43 and a Y scanning electrode 44 for electrically connecting these driver 41 and 42 to the pixels 45.

Each pixel 45 includes an organic EL element, which is controlled by a circuit that is arranged near the element and that includes a nanowire transistor. The nanowire transistor may have a configuration according to any of the preferred embodiments described above. On the flexible substrate 40, arranged are the X scanning electrode 43, Y scanning electrode 44, X driver 41 and Y driver 42 to control the nanowire transistors.

Referring to FIG. 15, it can be seen that the pixel 45 is controlled by a switching transistor 50 and a driver transistor 51. A voltage is applied from the Y driver 42 to the source electrode of the switching transistor 50 by way of the Y scanning electrode 44. The drain electrode of the switching transistor 50 and the gate electrode of the driver transistor 51 are electrically connected together. The drain electrode of the driver transistor 51 is electrically connected to a pixel electrode (not shown), which is arranged under the pixel. A voltage to make the pixel emit electroluminescence is applied to the source electrode of the driver transistor 51.

On the other hand, to the gate electrode of the switching transistor 50, applied is an image signal voltage from the X driver 41 by way of the X scanning electrode 43. A voltage is applied from the switching transistor 50, to which the image signal voltage has been applied, to the gate electrode of the driver transistor 51. As a result, a voltage is applied from the driver transistor 51 to the pixel electrode. Although not shown, a transparent electrode is arranged over the pixel. When a voltage is applied between the pixel electrode and the transparent electrode, the pixel portion produces electroluminescence.

EXAMPLES

Hereinafter, the transistor characteristic of a specific example having the configuration shown in FIG. 16 will be described.

Figure 16:
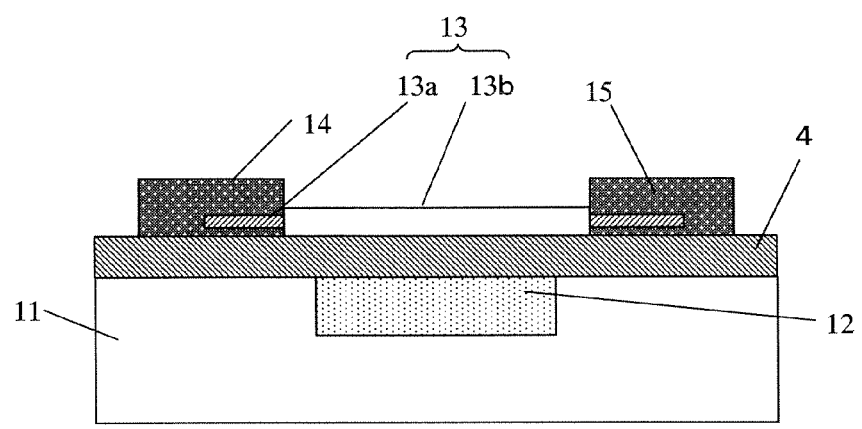
FIG. 16 is a cross-sectional view illustrating a transistor structure according to a specific example of the present invention.

Unlike the nanowire transistor of the preferred embodiment shown in FIGS. 4(a) and 4(b), the nanowire transistor shown in FIG. 16 includes a gate insulating film 4 of SiN with a thickness of 200 nm on the surface of the plastic substrate 11. In the other respects, the configuration shown in FIG. 16 is the same as that shown in FIG. 4(b).

In this specific example, the core portion 13a of the core-shell nanowire 13 is made of silicon, while the shell portion thereof is made of silicon dioxide. The silicon dioxide film has been formed by thermally oxidizing a silicon nanowire.

Figure 1:
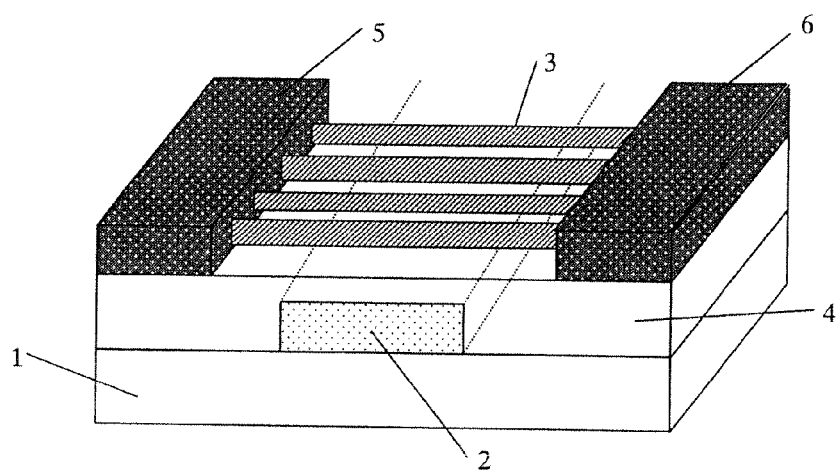
FIG. 1 is a perspective view illustrating the structure of a conventional nanowire transistor.
Figure 2:
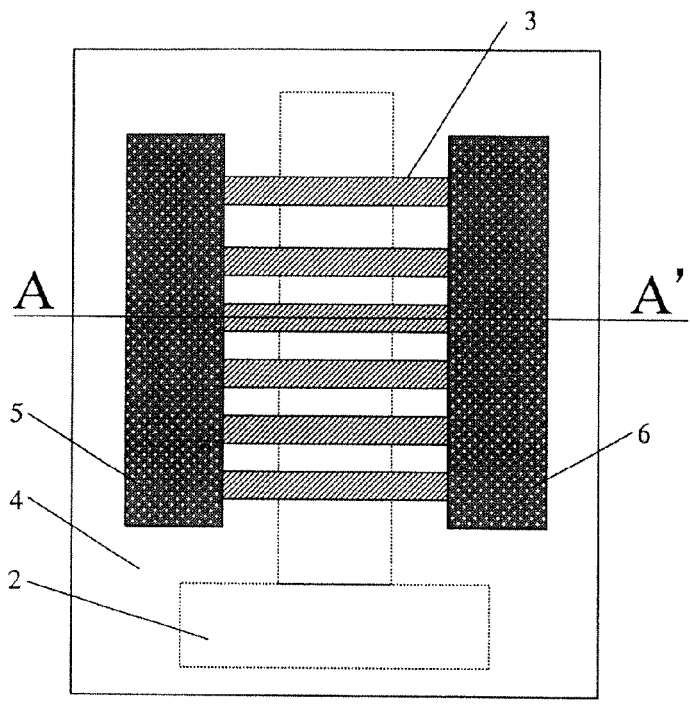
FIG. 2(a) is a top view of the nanowire transistor shown in FIG. 1
FIG. 2(b) shows a cross-sectional structure thereof as viewed on the plane A-A'.
Figure 2:
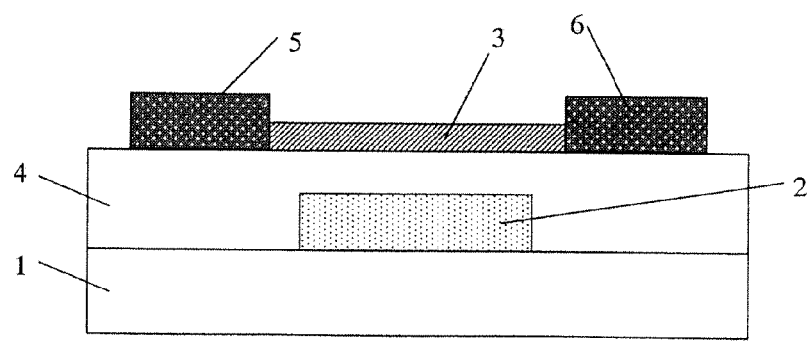
Figure 17:
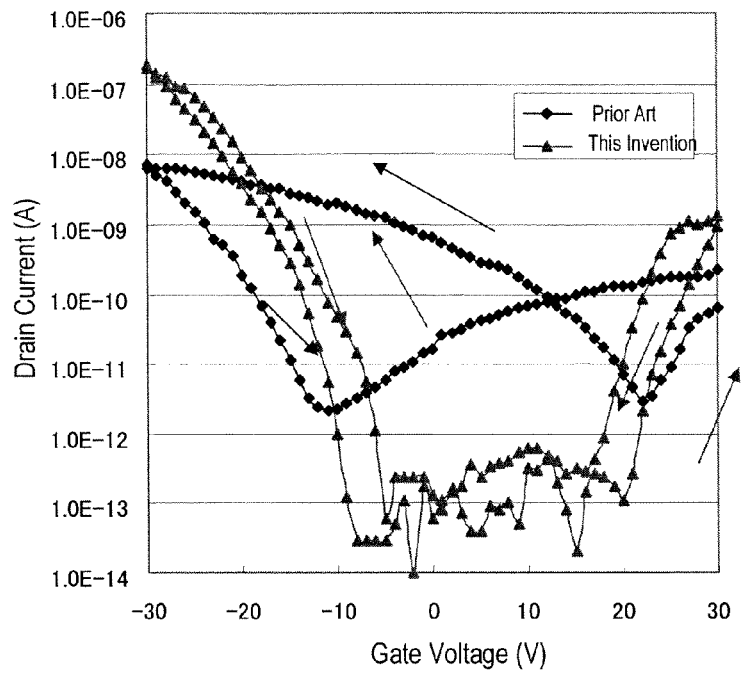
FIG. 17 is a graph showing the results of transistor characteristics that were evaluated on the specific example of the present invention and a conventional structure.

With a voltage of 10 V applied between the source and drain electrodes 14 and 15, gate voltages of various magnitudes were applied to the gate electrode 12 to turn the transistor ON. In the meantime, drain current flowing between the source and drain electrodes 14 and 15 was measured. The results are shown in FIG. 17, of which the abscissa represents the gate voltage and the ordinate represents the drain current. This graph also shows the results of measurements that were done on a conventional nanowire transistor with the configuration shown in FIG. 1. The shell portion 13b of this specific example had a thickness of 20 nm and the gate insulating film 4 had a thickness of 200 nm in both the specific example of the present invention and the conventional TFT.

As can be seen from FIG. 17, comparing this specific example to the conventional TFT, this specific example had a relatively large amount of drain current when the transistor was ON (which will be referred to herein as "ON-state current $I_{on}$") and a significantly small amount of drain current when the transistor was OFF (which will be referred to herein as "OFF-state current $I_{off}$"). The OFF-state current $I_{off}$ means leakage current and is preferably minimized. As can be seen easily from FIG. 17, the transistor of this specific example exhibited far better transistor characteristic than the conventional one.

Figure 18:
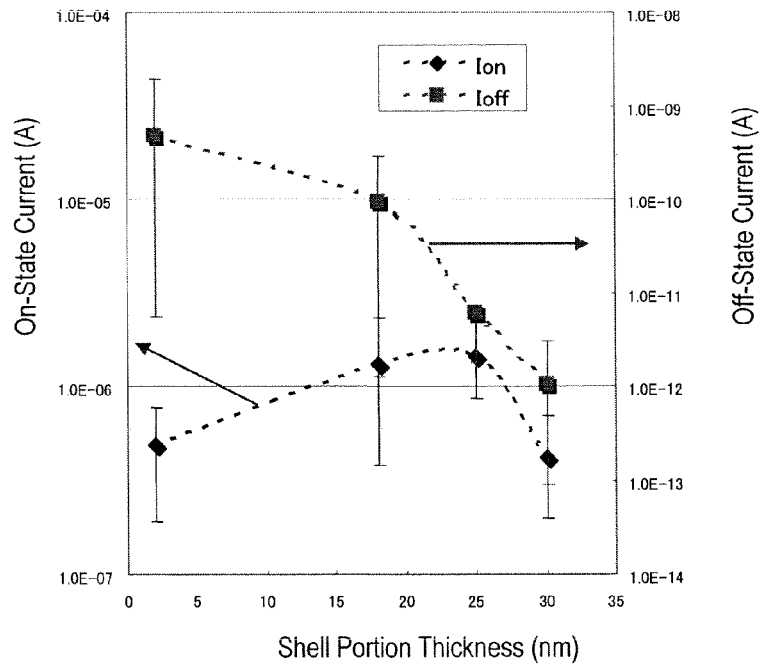
FIG. 18 is a graph showing how the amounts of drain currents changed with the thickness of the shell portion 13b in the specific example of the present invention.

FIG. 18 is a graph showing how the amounts of ON-state current $I_{on}$ and OFF-state current $I_{off}$ of the drain current changed with the thickness of shell portion 13b. The ordinate on the left-hand side of this graph represents the ON-state current $I_{on}$ when the gate voltage was −30 V, while the ordinate on the right-hand side of this graph represents the final value of the OFF-state current $I_{off}$. The thicker the shell portion 13b, the smaller the OFF-state current $I_{off}$.

Figure 19:
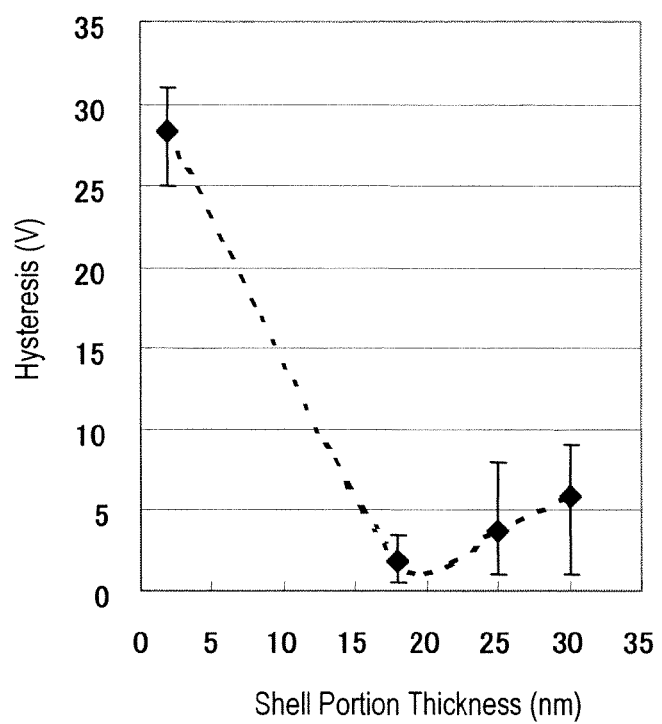
FIG. 19 is a graph showing the hysteresis characteristic of the transistor of the specific example.

FIG. 19 is a graph showing the hysteresis characteristic of the transistor. In the example shown in FIG. 17, the gate-drain characteristic changed depending on whether the gate voltage was decreased from 0 V to −30 V or increased from −30 V to 0 V. That is to say, the gate voltage associated with a drain current of $1.0 \times 10^{-8}$ A changed depending on whether the gate voltage was increasing or decreasing. Such a difference in gate voltage will be referred to herein as "hysteresis". FIG. 19 is a graph showing how the hysteresis changes with the thickness of the shell portion 13b. As can be seen from FIG. 19, if the shell portion 13b had a thickness of less than 15 nm, the hysteresis would increase.

Taking these results into consideration, the shell portion 13b preferably has a thickness of at least 15 nm, more preferably 20 nm or more.

It should be noted that the thickness of the shell portion 13b to be formed depends on the diameter of the nanowire material yet to be thermally oxidized. The thickness of the shell portion 13b is preferably 15% to 75% of the diameter of the nanowire material. In that case, the diameter of the thermally oxidized core portion 13a will be 0.3 to 6 times as large as the thickness of the shell portion 13b.

The present application hereby incorporates by reference the entire disclosures of Japanese Patent Applications Nos. 2006-93760 and 2007-72887, which were filed with the Japan Patent Office on Mar. 30, 2006 and Mar. 20, 2007, respectively.

What is claimed is:

1. A method for fabricating a nanowire transistor, the method comprising steps of:
    providing at least one nanowire including a core portion that functions as a channel region and an insulating shell portion that covers the surface of the core portion; and
    forming source and drain electrodes to be connected to the nanowire and also forming a gate electrode for controlling conductivity in at least a part of the core portion of the nanowire,
    wherein the step of providing the nanowire includes steps of:
    forming a nanowire material, which is made of semiconductor single crystals including Si and which has a polygonal cross section on a plane that intersects with the longitudinal axis thereof, by a crystal growing process; and
    thermally oxidizing the surface of the nanowire material to form the insulating shell portion on the surface, and
    wherein the step of thermally oxidizing comprises thermally oxidizing the surface of the nanowire material having the polygonal cross section such that a cross section that intersects with the longitudinal axis of the core portion has a curved profile.

2. The method of claim 1, wherein:
    the nanowire material has a diameter of at least 35 nm, and
    the step of thermally oxidizing includes thermally oxidizing the surface until the insulating shell portion has a thickness of 15 nm or more.

3. The method of claim 1, wherein the step of thermally oxidizing comprises oxidizing the surface of the nanowire material by a rapid thermal process.

* * * * *